(12) United States Patent
Chen et al.

(10) Patent No.: US 10,115,796 B2
(45) Date of Patent: Oct. 30, 2018

(54) METHOD OF PULLING-BACK SIDEWALL METAL LAYER

(71) Applicant: Taiwan Semiconductor Manufacturing Company, Ltd., Hsin-Chu (TW)

(72) Inventors: Jin-Dah Chen, Hsin-Chu (TW); Han-Wei Wu, Tainan (TW); Ming-Feng Shieh, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/990,059

(22) Filed: Jan. 7, 2016

(65) Prior Publication Data
US 2017/0200798 A1    Jul. 13, 2017

(51) Int. Cl.
| | |
|---|---|
| *H01L 29/423* | (2006.01) |
| *H01L 21/306* | (2006.01) |
| *H01L 21/283* | (2006.01) |
| *H01L 21/308* | (2006.01) |
| *H01L 21/28* | (2006.01) |
| *H01L 29/66* | (2006.01) |
| *H01L 21/3213* | (2006.01) |

(52) U.S. Cl.
CPC ........ *H01L 29/4236* (2013.01); *H01L 21/283* (2013.01); *H01L 21/28088* (2013.01); *H01L 21/3085* (2013.01); *H01L 21/30604* (2013.01); *H01L 29/66545* (2013.01); *H01L 21/32139* (2013.01)

(58) Field of Classification Search
CPC .......... H01L 29/66545; H01L 29/4966; H01L 29/517; H01L 21/823842; H01L 21/28088; H01L 21/823814; H01L 27/092; H01L 29/78
USPC .... 257/E21.19, 369, E29.255; 438/591, 592, 438/585, 197, 587
See application file for complete search history.

(56) References Cited

U.S. PATENT DOCUMENTS

| | | | |
|---|---|---|---|
| 7,667,271 B2 | 2/2010 | Yu et al. | |
| 7,785,984 B2 * | 8/2010 | Yamada ............... | C23C 16/045 438/435 |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |

(Continued)

*Primary Examiner* — Jonathan Han
(74) *Attorney, Agent, or Firm* — Haynes and Boone, LLP

(57) ABSTRACT

A method of fabricating a semiconductor device includes forming a first, a second and a third trenches extending through a dielectric layer over a substrate, forming a material layer in the first, the second and the third trenches, forming a sacrificial layer to fully fill in the remaining first and the second trenches, recessing the sacrificial layer in the first trench and the second trench, recessing the material layer in the first trench and in the second trench. After recessing the material layer, a top surface of the remaining material layer is co-planar with a top surface of the remaining sacrificial layer in the first trench and a top surface of the remaining material layer is co-planar with a top surface of the remaining sacrificial layer in the second trench. The method also includes removing the remaining sacrificial layer in the first trench and the second trench.

20 Claims, 12 Drawing Sheets

(56) References Cited

U.S. PATENT DOCUMENTS

| | | |
|---|---|---|
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 2012/0313178 A1* | 12/2012 | Liao .................. H01L 29/66545 257/368 |
| 2012/0319205 A1* | 12/2012 | Hempel .......... H01L 21/823842 257/368 |
| 2013/0005133 A1* | 1/2013 | Lee .................. H01L 29/66545 438/595 |
| 2013/0249010 A1* | 9/2013 | Ng .................. H01L 21/823842 257/369 |
| 2013/0295758 A1* | 11/2013 | Kim ................ H01L 21/823885 438/589 |
| 2013/0299922 A1* | 11/2013 | Choi ................ H01L 21/82345 257/412 |
| 2014/0001574 A1 | 1/2014 | Chen et al. |
| 2014/0110755 A1 | 4/2014 | Colinge |
| 2014/0151812 A1 | 6/2014 | Liaw |

* cited by examiner

METHOD OF PULLING-BACK SIDEWALL METAL LAYER

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

When a semiconductor device such as a metal-oxide-semiconductor field-effect transistor (MOSFET) is scaled down through various technology nodes, high-k (HK) dielectric material and metal gate (MG) are adopted to form a gate stack. Although existing methods of fabricating IC devices have been generally adequate for their intended purposes, they have not been entirely satisfactory in all respects. For example, challenges rise to develop robust processes for HK/MG formation.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
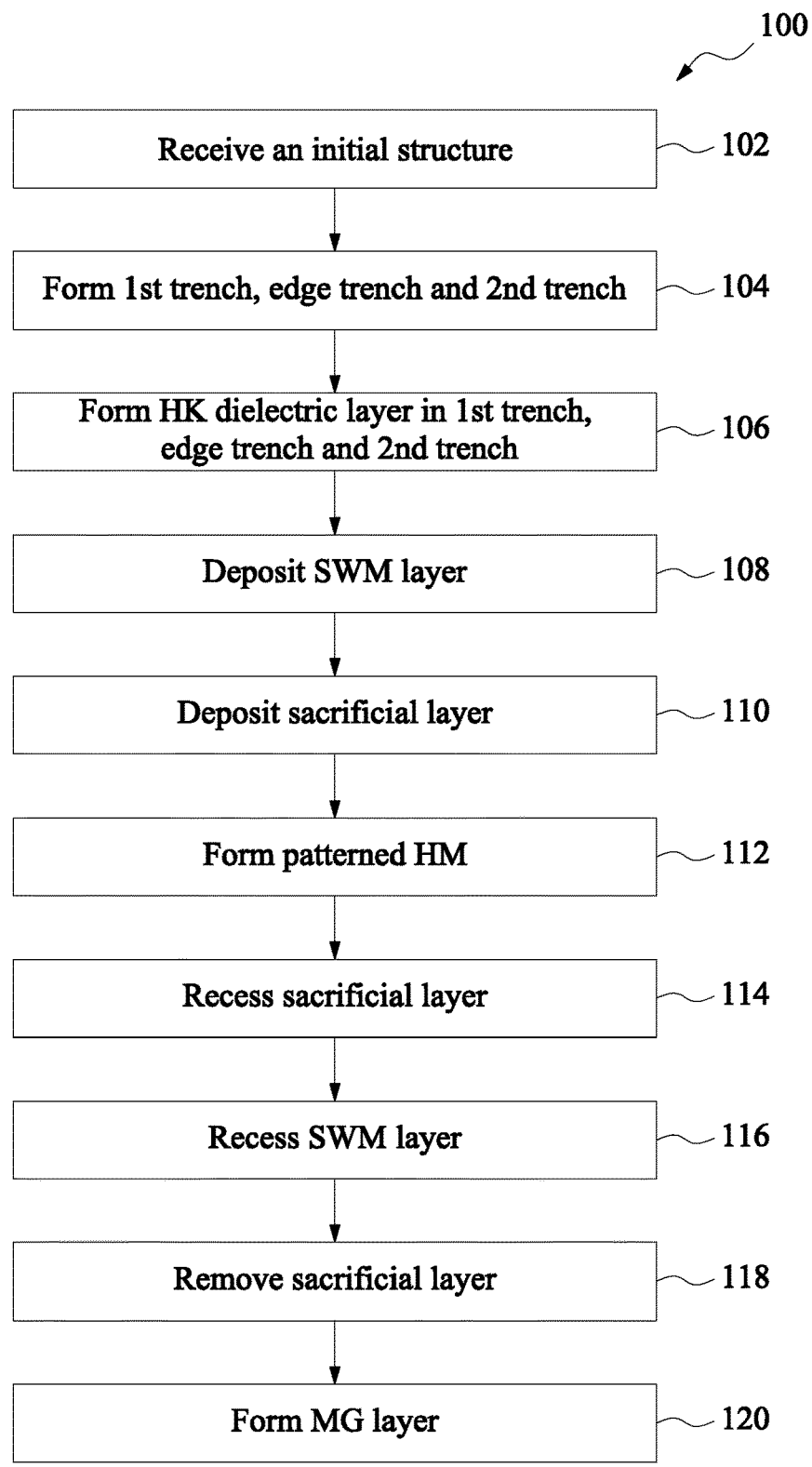
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to an initial structure 205 of a semiconductor device 200, shown in FIG. 2, and a semiconductor device 200, shown in FIGS. 3 through 11. The method 100 is merely an example, and is not intended to limit the present disclosure beyond what is explicitly recited in the claims. The device 200 may be an IC, or a portion thereof, that may comprise static random access memory (SRAM) and/or other logic circuits, passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. The device 200 may include three-dimensional devices and multi-gate devices such as double gate FETs, FinFETs, tri-gate FETs, omega FETs, and gate-all-around (GAA) devices including vertical GAA devices and horizontal GAA devices.

Figure 2:
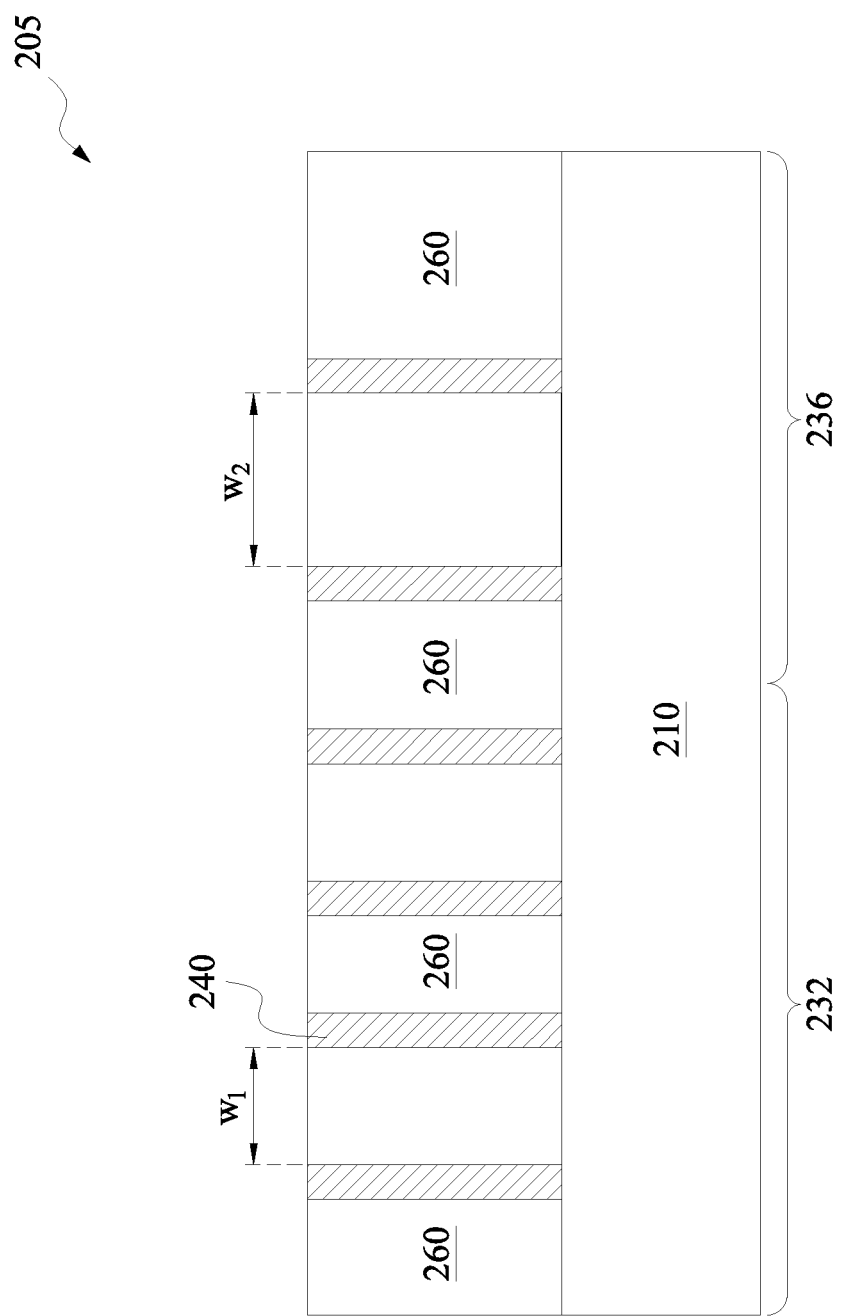
FIG. 2 is a cross-sectional view of an example of an initial structure of a semiconductor device in accordance with some embodiments.

Referring to FIGS. 1 and 2, the method 100 begins at step 102 by receiving an initial structure 205 of the semiconductor device 200. The initial structure 205 includes a substrate 210. The substrate 210 may be a bulk silicon substrate. Alternatively, the substrate 210 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary initial structure 205, the insulator layer is a component (e.g., layer) of a silicon-on-insulator substrate.

The substrate 210 may also include various p-type doped regions and/or n-type doped regions, implemented by a process such as ion implantation and/or diffusion. Those doped regions include n-well, p-well, light doped region (LDD), doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit.

The initial structure 205 also includes first dummy gates 225 and a second dummy gate 226. The first and second dummy gates, 225 and 226, may be replaced later by high-k (HK) and metal gate (MG) after high thermal temperature processes are performed, such as thermal processes during sources/drains formation. The first and second dummy gates, 225 and 226, may include a dummy gate dielectric layer and a polysilicon layer and may be formed by deposition, patterning and etching processes. In the present embodiment, the first dummy gate 225 has a first width $w_1$ and the second dummy gate 226 has a second width $w_2$, which is greater than the first width $w_1$. As an example, the second width $w_2$ is more than 30% greater than the first width $w_1$.

The initial structure 205 also includes sidewall spacers 240 formed along the sidewalls of the first and second dummy gates, 225 and 226. The sidewall spacers 240 may include a dielectric material such as silicon nitride. Alternatively, the sidewall spacers 240 may include silicon carbide, silicon oxynitride, and/or other suitable material. The sidewall spacers 240 may be formed by depositing a gate sidewall spacer layer and then anisotropic dry etching the gate sidewall spacer layer.

The initial structure 205 also includes a dielectric layer 260 disposed over the substrate 210, including between first and second dummy gates, 225 and 226. The dielectric layer 260 may include silicon oxide, silicon nitride, or silicon oxynitride, a dielectric material having a dielectric constant (k) lower than thermal silicon oxide (therefore referred to as low-k dielectric material layer), and/or other suitable dielectric material layer. The dielectric layer 260 may include a single layer or multiple layers. The dielectric layer 260 may be deposited by chemical vapor deposition (CVD), atomic layer deposition (ALD), thermal oxidation or ozone oxidation, spin-on coating, other suitable technique, or a combination thereof.

Figure 3:
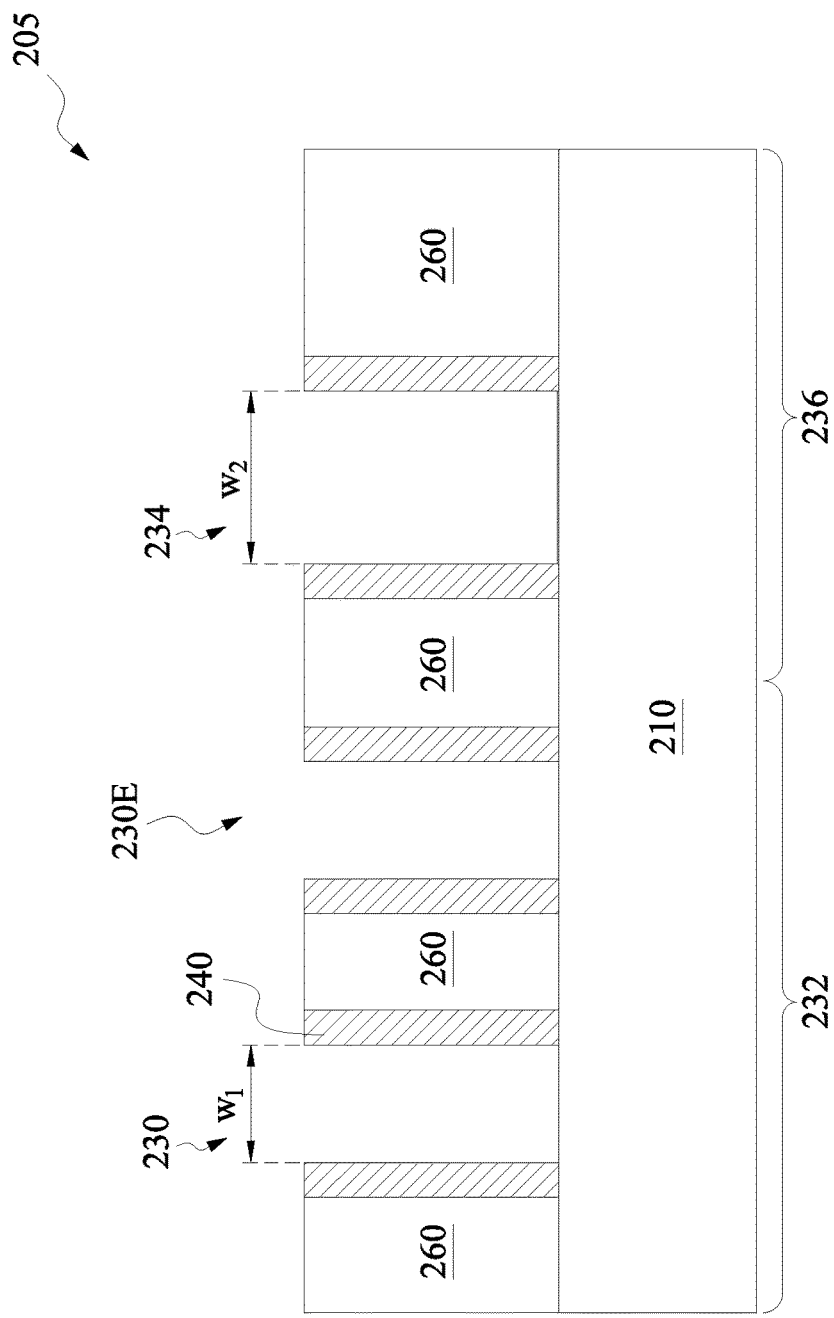
FIGS. 3, 4, 5, 6, 7, 8, 9A, 9B, 10 and 11 are cross-sectional views of an example semiconductor device in accordance with some embodiments.

Referring to FIGS. 1 and 3, once the initial structure 205 is received, method 100 proceeds to step 104 by removing first and second dummy gates, 225 and 226, to form first trenches 230 and a second trench 234, respectively. In some embodiment, the etch process is chosen to selectively etch the first and second dummy gates, 225 and 226, without substantially etching the sidewall spacer 240 and the dielectric layer 260. The selective etch process may include a wet etch, a dry etch, and/or a combination thereof.

In the present embodiment, the first trenches 230 are formed in a first region 232 and a second trench 234 is formed in a second region 236. The second region 236 is adjacent to the first region 232 and therefore one of the first trenches 230 is adjacent to the second trench 234, referred to as an edge trench 230E. Each of first and second trenches, 230, 230E and 234 is separated by the dielectric layer 260.

In the present embodiment, the first trenches 230 (including the edge trench 230E) have a first width $w_1$ and the second trench 234 has a second width $w_2$, which is greater than the first width $w_1$. As an example, the second width $w_2$ is more than 30% greater than the first width $w_1$.

Figure 4:
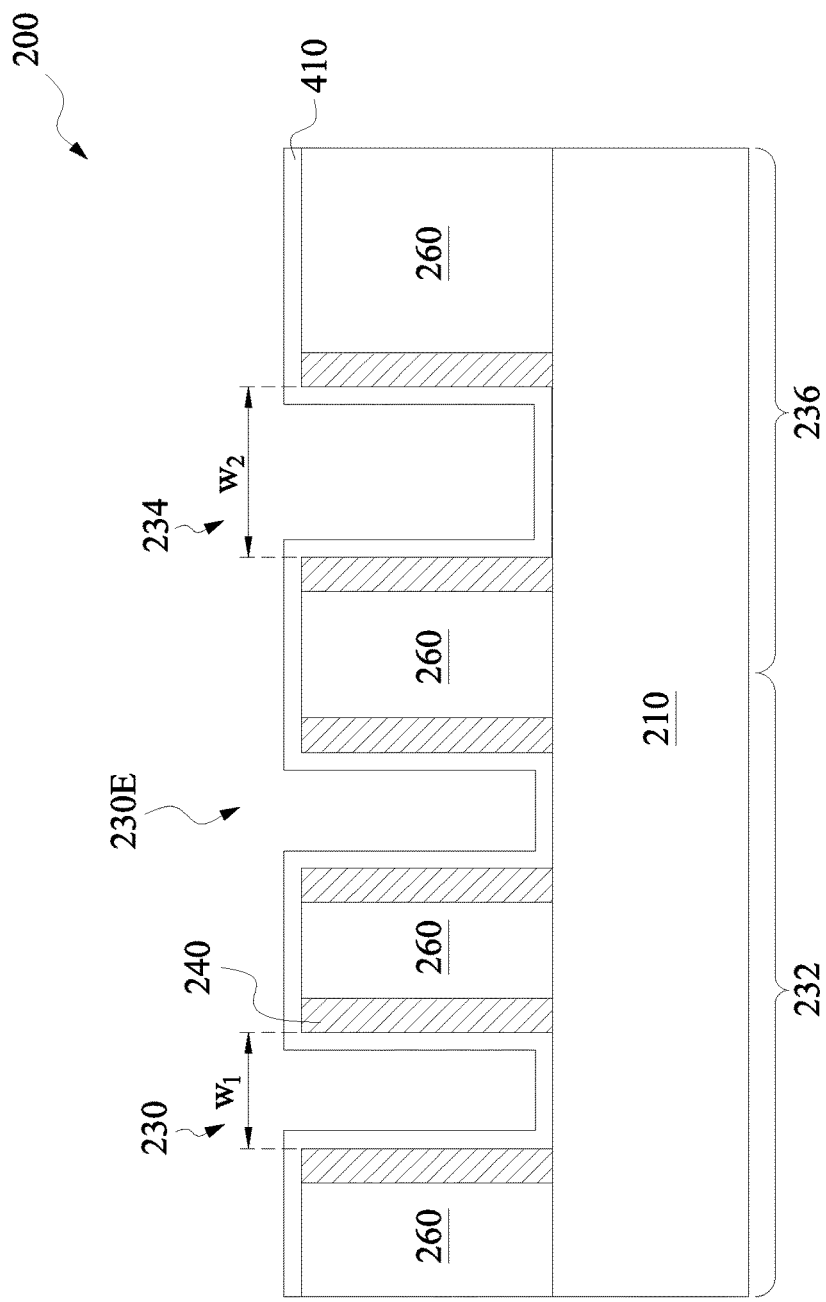

Referring to FIGS. 1 and 4, method 100 proceeds to step 106 by depositing a first material layer 410 in the first trenches 230 and 230E as well as second trench 234. In some embodiments, the first material layer 410 includes a high-k (HK) dielectric layer and is deposited along sidewall spacers 240 and in the bottoms of the first and second trenches 230, 230E, and 234. The HK dielectric layer 410 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The HK dielectric layer 410 may be deposited by a suitable method, such as CVD, ALD, thermal oxidation or ozone oxidation, other suitable technique, or a combination thereof.

Figure 5:
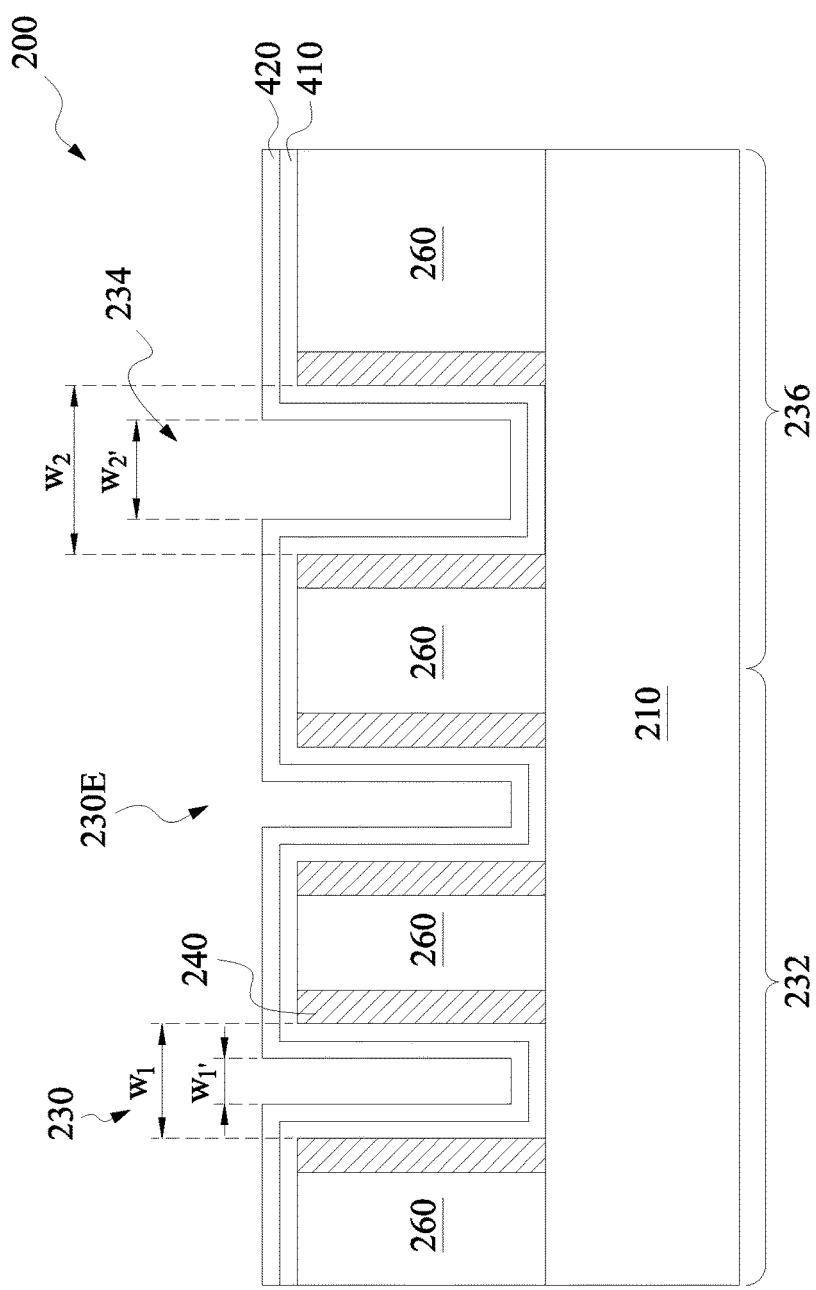

Referring to FIGS. 1 and 5, method 100 proceeds to step 108 by depositing a second material layer 420 over the first material layer 410 in the first and second trenches 230, 230E, and 234. In some embodiments, the second material layer 420 includes a sidewall metal (SWM) layer deposited over the HK dielectric layer 410. The SWM layer 420 may include a single metal layer or multi-metal layer structure. The SWM layer 420 may include a work function (WF) layer. The SWM layer 420 may include titanium (Ti), titanium nitride (TiN), tantalum nitride (TaN), tungsten nitride (WN), titanium silicon nitride (TiSiN), aluminum (Al), titanium aluminum nitride (TiAlN), manganese (Mn), manganese nitride (MnN), and/or combination thereof. The second material layer 420 may be formed by ALD, physical vapor deposition (PVD), CVD, or other suitable process. With sidewall spacers 240 and the first and second material layers, 410 and 420, both the first width $w_1$ and the second width $w_2$ are reduced to first width $w_1'$ and second width $w_2'$, respectively. The reduced second width $w_2'$ is substantial greater than the reduced first width $w_1'$. As an example, the reduced second width $w_2'$ is more than 30% greater than the reduced first width $w_1'$.

According to some methods for manufacturing a semiconductor device, the second material layer 420 along sidewalls of the first trenches 230 and 230E needs to be recessed (also referred to as pulling-back). To recess or pull-back the second material layer 420, it is typically achieved by filling in the first and second trenches with a sacrificial layer, recess the sacrificial layer and then pull-back the second material layer 420. Because the first trench 230 and edge trench 230E have different surrounding environments, such as the edge trench 230E is adjacent to a wider trench, namely the second trench 234, a thickness of the sacrificial layer filled in the first trench 230 may be different from the one filled in the edge trench 230E. As a result, a recessed sacrificial layer in the first trench 230 may have a different height than the one in the edge trench 230E. This results in undesired height differentials of the pulled-back second material layers 420 in the first trenches 230 and 230E. In the present embodiment, method 100 provides a scheme for reducing the height difference of the pulled-back second material layers 420 in the first trench 230 and in the edge trench 230E.

Figure 6:
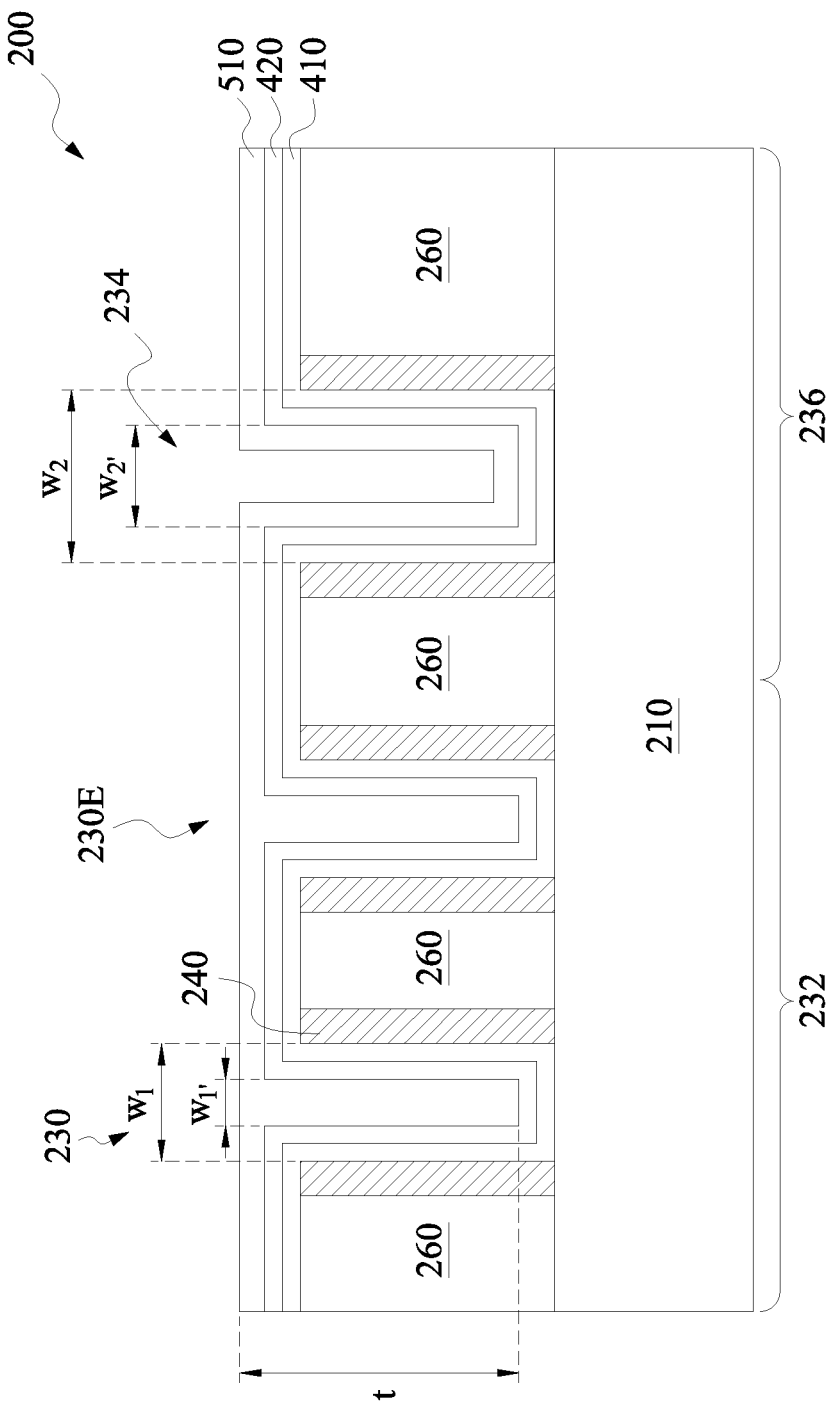

Referring to FIGS. 1 and 6, method 100 proceeds to step 110 by depositing a sacrificial layer 510 over the second material layer 420. In the present embodiment, the sacrificial layer 510 is deposited conformally in the first and second trenches, 230, 230E, and 234, such that the sacrificial layer 510 has a uniform thickness tin the first trenches 230 and 230E. The sacrificial layer 510 may be deposited by ALD, CVD, and/or other technique. In an embodiment, the sacrificial layer 510 is deposited by ALD. In some embodiments, the first trenches 230 and 230E are fully filled in by the sacrificial layer 510 and the second trench 234 is partially filled in by the sacrificial layer 510. As shown in FIG. 5, first trenches 230E are completely filled by sacrificial layer 510 while a portion of second trench 234 remains unfilled after the deposition of sacrificial layer 510. Sacrificial layer 510 may include silicon nitride, silicon carbide, titanium oxide, titanium nitride, tantalum oxide, tantalum nitride, and/or any suitable materials. In the present embodiment, the sacrificial layer 510 includes a material which is different from the second material layer 420 to achieve etching selectivity during subsequent etch processes. In an embodiment, the second material layer 420 includes titanium nitride (TiN) while the sacrificial layer 510 includes silicon nitride (SiN).

Figure 7:
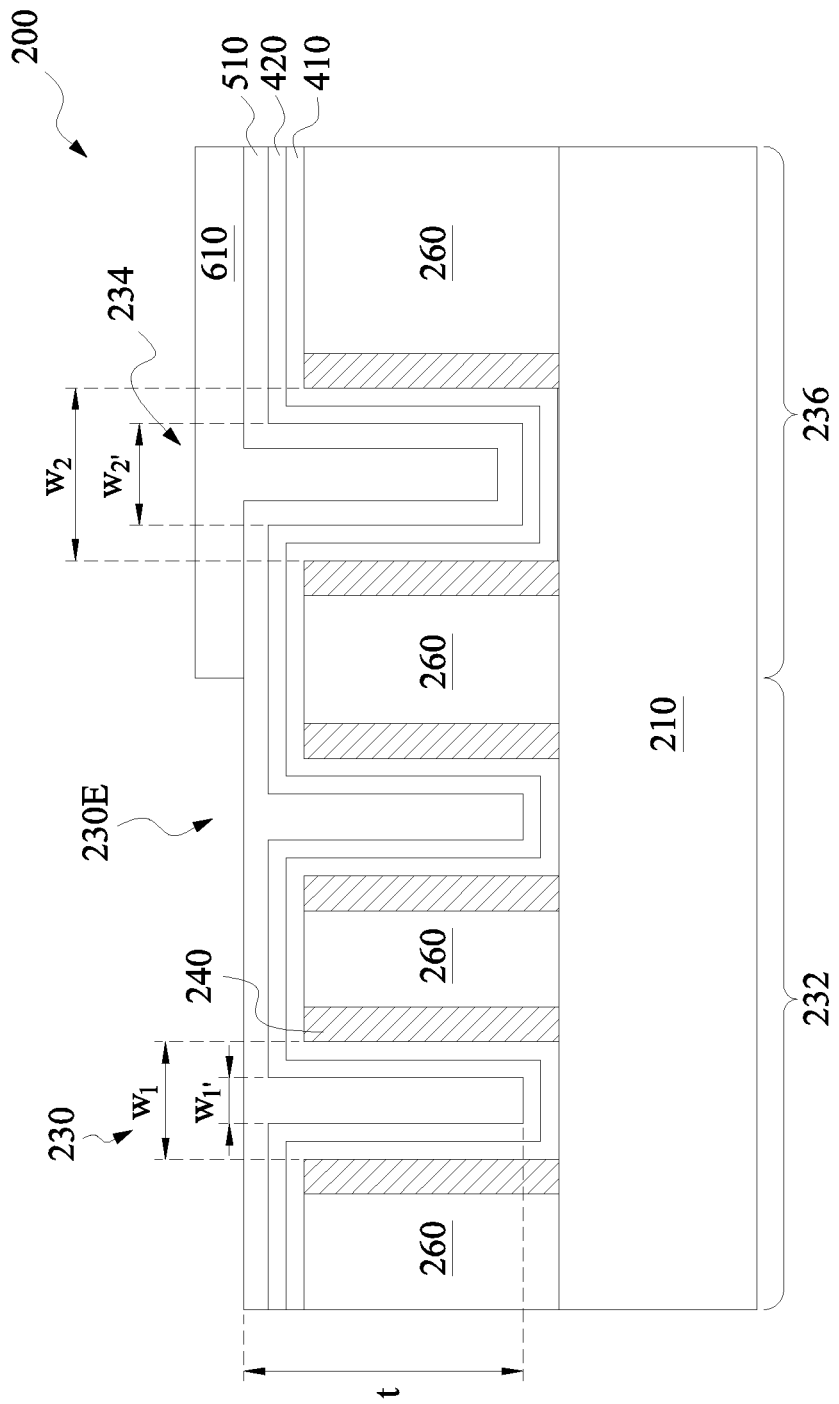

Referring to FIGS. 1 and 7, method 100 proceeds to step 112 by forming a patterned hard mask (HM) 610 to cover the second region 236, including filling in the remaining portion of second trench 234, while leaving the first region 232 uncovered. In some embodiments, the patterned HM 610 may include a patterned photoresist layer and formed by a by a lithography process. An exemplary lithography process may include forming a photoresist layer, exposing the photoresist layer by a lithography exposure process, performing a post-exposure bake process, and developing the photoresist layer to form the patterned resist layer.

Alternatively, the patterned HM 610 may be formed by depositing a HM layer, such as silicon oxide, silicon nitride, silicon oxynitride, or any other suitable dielectric material, forming a patterned photoresist layer over the HM layer by a lithography process and etching the HM material layer through the patterned photoresist layer to form the patterned HM 610.

Figure 8:
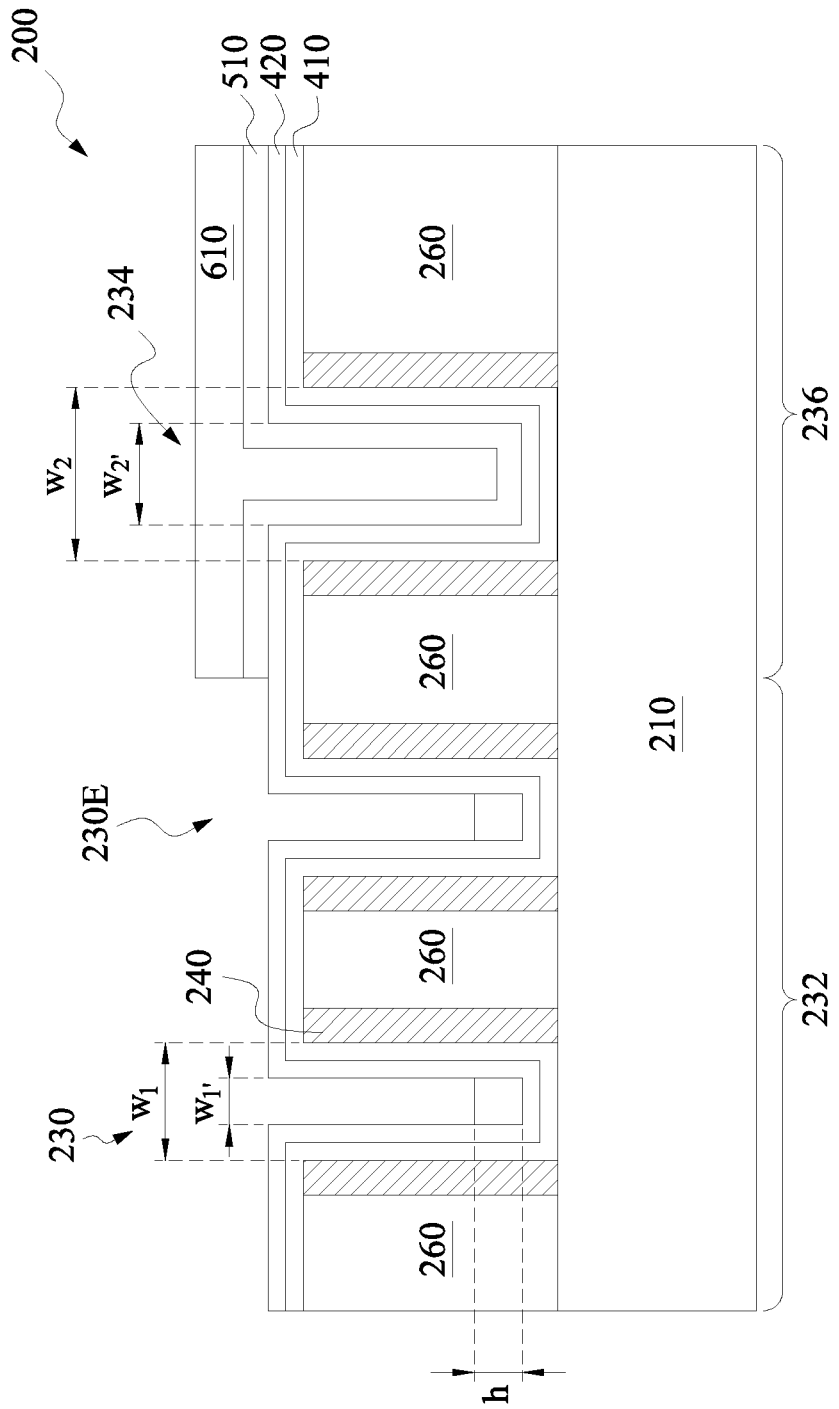

Referring to FIGS. 1 and 8, the method 100 proceeds to step 114 by recessing the sacrificial layer 510 to expose a portion of the second material layer 420 along sidewalls of first trench 230 and the edge trench 230E while the second region 236 is covered by the patterned HM 610. The etch process may include a wet etch, a dry etch, and/or a combination thereof. As an example, a dry etching process may implement fluorine-containing gas (e.g., $CF_4$, $SF_6$, $CH_2F_2$, $CHF_3$, and/or $C_2F_6$), other suitable gases and/or plasmas, and/or combinations thereof. In some embodiments, the etch process is chosen to selectively etch the sacrificial layer 510 without substantially etching the second material layer 420. As has been mentioned previously, with an adequate etch selectivity, the second material layer 420 serves as an etch stop layer, which improves etch process window and profile control.

In the present embodiment, the sacrificial layer 510 is recessed such that a portion of the sacrificial layer 510 remains in the first trench 230 and the edge trench 230E. In the present embodiment, because the sacrificial layer 510 has the same thickness, namely t, in the first trench 230 and the edge trench 230E this allows the remaining portion of the sacrificial layer 510 to have the same height h left in the first trench 230 and the edge trench 230E.

Figure 9A:
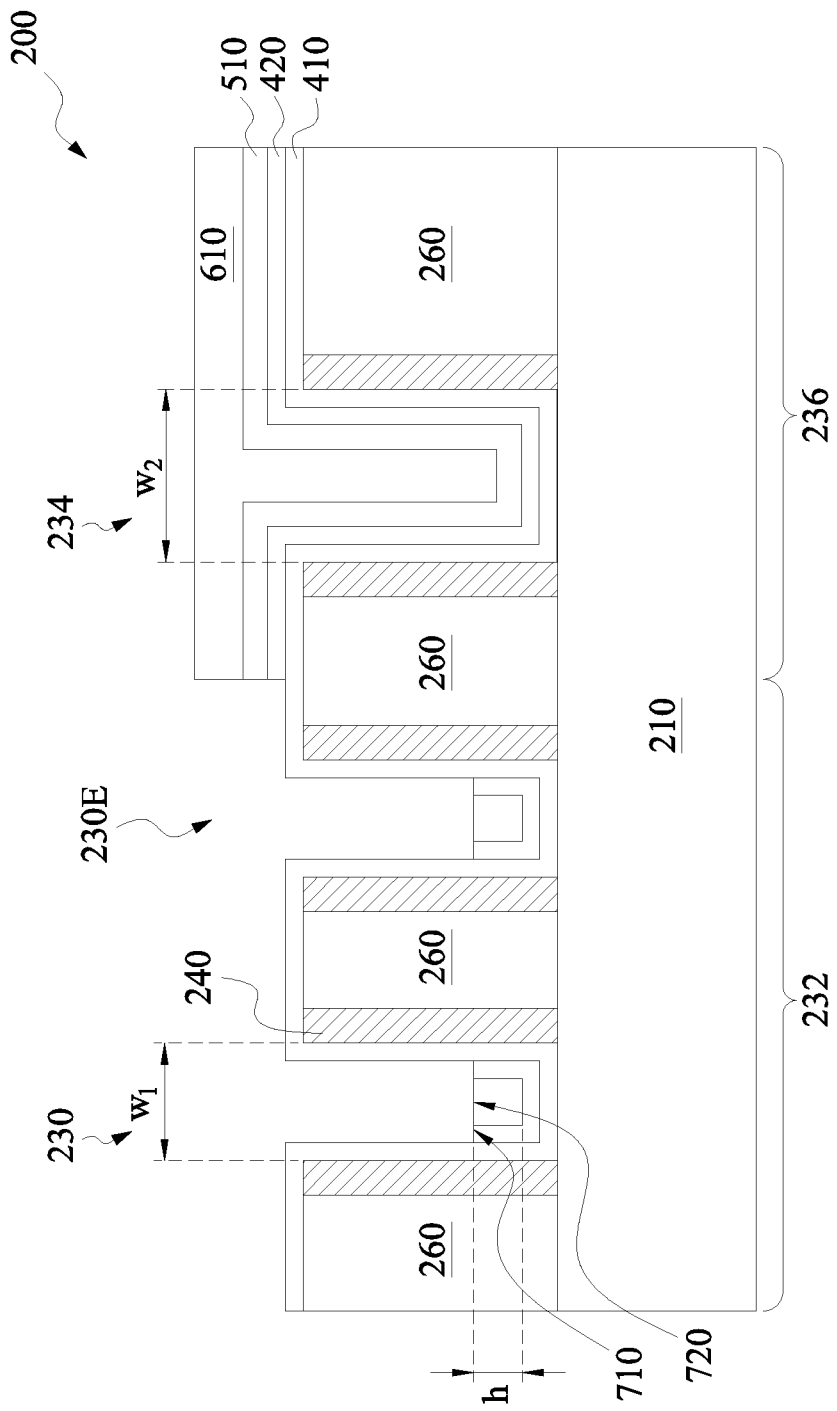

Referring to FIGS. 1 and 9A, the method 100 proceeds to step 116 by recessing (pulling-back) the second material layer 420 in the first trench 230 and the edge trench 230E while the second region 236 is covered by the patterned HM 610. In some embodiment, the second material layer 420 (or SWM layer) is pulled-back by an etching process. Such an etch process may include a wet etch, a dry etch, and/or a combination thereof. As an example, the second material layer 420 is recessed by a dry etching process with chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. The etch process may include a multiple-step etching to gain etch selectivity, flexibility and desired etch profile. In the present embodiments, the etch process is chosen to selectively etch the second material layer 420 without substantially etching the remaining sacrificial layer 510. As a result, a top surface 710 of the second material layer 420 along sidewalls of the first trench 230 (over the first material layer 410) and the edge trench 230E are co-planar with a top surface 720 of the remaining sacrificial layer 510.

Figure 9B:
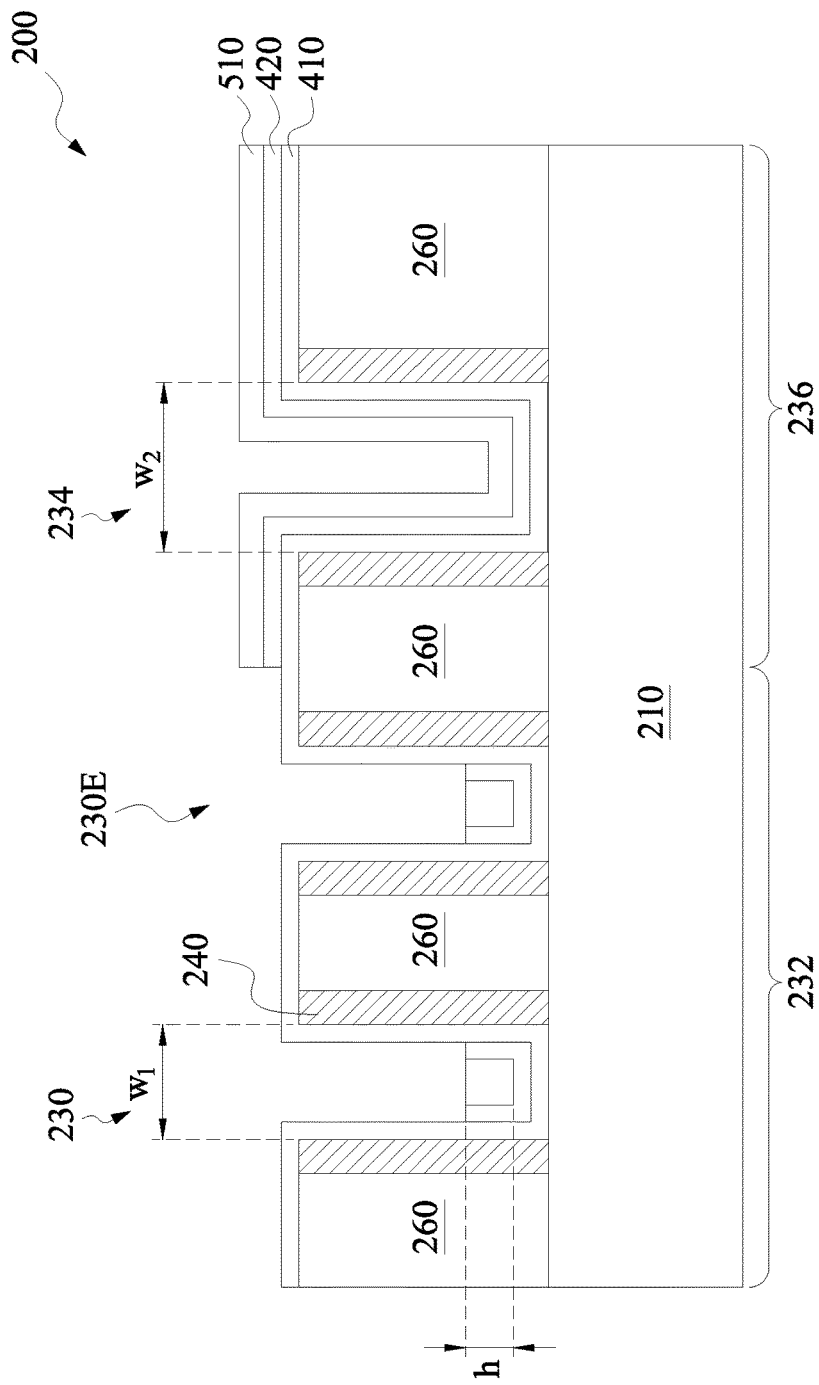

As shown in FIG. 9B, after recessing the second material layer 420, the pattered HM 610 is removed by an etch process. In one example where the patterned HM 610 is a resist pattern, the patterned HM 610 is removed thereafter by wet stripping and/or plasma ashing.

Figure 10:
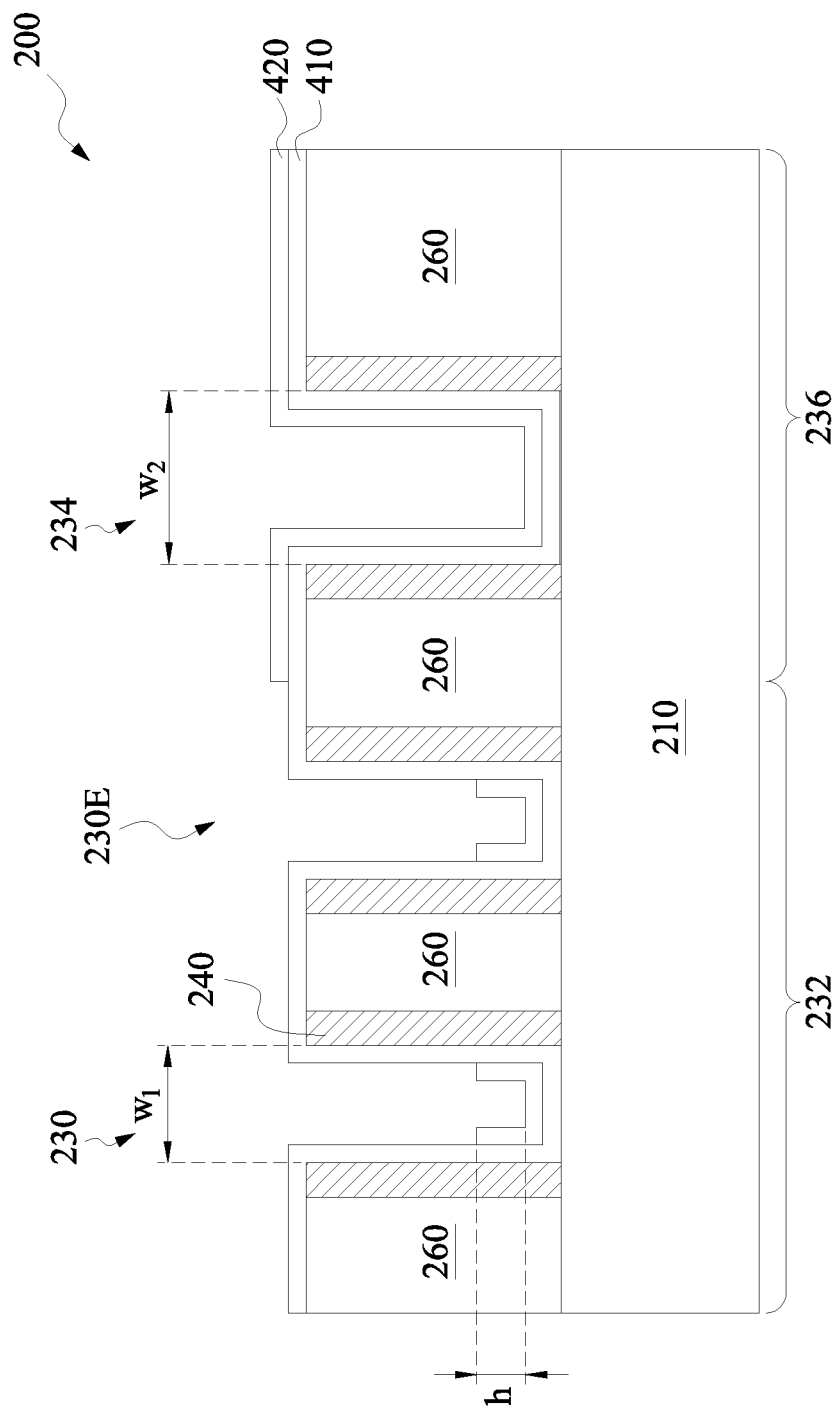

Referring to FIGS. 1 and 10, the method 100 proceeds to step 118 by removing the sacrificial layer 510 from both of the first and second regions, 232 and 236. The etch process may include a wet etch, a dry etch, and/or a combination thereof. In the present embodiment, the etch process is chosen to selectively etching sacrificial layer 510 without substantially etching the second material layer 420 and the first material layer 410. As a result, in the first region 232, the pull-backed second material layers 420 disposed along lower portions of sidewalls of the first trench 230 and the edge trench 230E have a uniform height, namely the height h. In the second region 236, the second material layer 420 is disposed along full sidewalls of the second trench 234.

Figure 11:
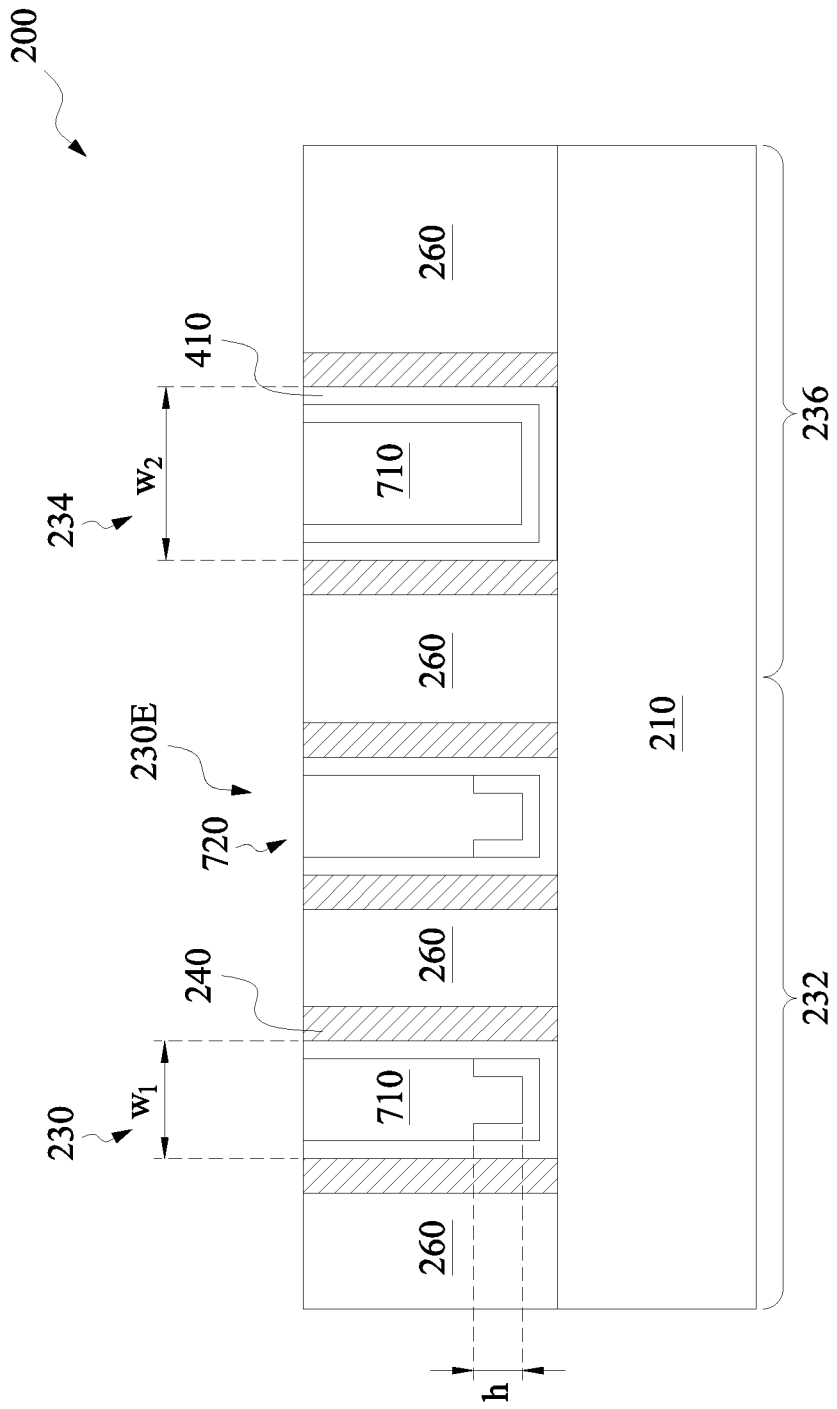

Referring to FIGS. 1 and 11, the method 100 proceeds to step 120 by forming a third material layer 710 in the first trench 230, the edge trench 230E and the second trench 234. In some embodiment, the third material layer 710 includes metal gate (MG) layer. The MG layer 710 may include a single layer or alternatively a multi-layer structure. The MG layer 710 may include W, Ti, Ag, Al, TiAlN, TaC, TaCN, TaSiN, Mn, Zr, TiN, TaN, Ru, Mo, Al, WN, Cu, any suitable materials or a combination thereof. The MG layer 710 may be formed by ALD, PVD, CVD, or other suitable process. Additionally, a CMP process is performed to remove excessive MG layer and the SWM layer 420. The CMP process provides a substantially planar top surface for the MG electrode 710 and the dielectric layer 260. As a result, in the first region 232, an upper portion of the MG layer 710 contacts with the HK layer 410 and a lower portion of the MG layer 710 contacts with the pulled-back SWM layer 420, while in the second region 236, both of the upper portion and lower portion of the MG layer 710 contacts with the SWM layer 420. The HK layer 410, the pulled-back SWM layer 420 and the MG layer 710 form a first HK/MG 720 in the first region 232 and the HK layer 410, the pulled-back SWM layer 420 and the MG layer 710 form a first HK/MG 720 in the first region 232.

Additional steps can be provided before, during, and after the method 100, and some of the steps described can be replaced, eliminated, or moved around for additional embodiments of the method 100.

The semiconductor devices, 200, may include additional features, which may be formed by subsequent processing. For example, various vias/lines and multilayers interconnect features (e.g., metal layers and interlayer dielectrics) are formed over the substrate 210. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, it can be seen that the present disclosure provide methods of pulling-back sidewall metal layer) layer along sidewalls of first gate trenches with an uniform height while at least one of the first gate trenches is adjacent to a second gate trench, which has a greater width than a width of the first trench. The method employs conformably depositing a sacrificial layer to fill in the first and second trenches with a same thickness and achieves recessed the sacrificial layer having a same height, which results SWM layer to be pulled back to a same height. The method demonstrates a robust SWM pulling-back process.

The present disclosure provides many different embodiments of fabricating a semiconductor device that provide one or more improvements over existing approaches. In one embodiment, a method for fabricating a semiconductor device includes forming a first trench, a second and a third trench extending through a dielectric layer over a substrate. The second trench is positioned between the first trench and the third trench. The first trench and the second trench have a first width while the third trench has a second width which is greater than the first width. The method also includes forming a material layer in the first trench, the second trench and the third trench, forming a sacrificial layer to fully fill in the remaining first trench and the second trench. A thickness of the sacrificial layer in the first trench is same as it is in the second trench. The method also includes recessing the sacrificial layer in the first trench and the second trench. A remaining thickness of the sacrificial layer in the first trench is same as in the second trench. The method also includes recessing the material layer in the first trench and in the second trench. After recessing the material layer, a top surface of the remaining material layer is co-planar with a top surface of the remaining sacrificial layer in the first trench and a top surface of the remaining material layer is co-planar with a top surface of the remaining sacrificial layer in the second trench. The method also includes removing the remaining sacrificial layer in the first trench and the second trench.

In yet another embodiment, a method includes forming a first trench, a second and a third trench in a dielectric layer disposed over a substrate. The second trench is positioned between the first trench and the third trench. The first trench and the second trench have a first width and the third trench has a second width which is different than the first width. The method also includes forming a sidewall-metal (SWM) layer along sidewalls of the first trench, the second trench and the third trench, forming a sacrificial layer over the SWM layer to fully fill in the remaining first trench and the second trench and fill in the third trench. A thickness of the sacrificial layer in the first trench is the same as it is in the second trench. The method also includes forming a hard mask over the sacrificial layer in the third trench and recessing the sacrificial layer in the first trench and the second trench. A remaining thickness of the recessed sacrificial layer in the first trench is the same as it is in the second trench. The method also includes recessing the SWM layer in the first trench and in the second trench while the hard mask covers the third trench. After recessing the SWM layer, a top surface of the recessed SWM layer along sidewalls of the first trench is co-planar with a top surface of the recessed sacrificial layer in the first trench and a top surface of the recessed SWM layer along sidewalls of the second trench is co-planar with a top surface of the recessed sacrificial layer in the second trench. The method also includes removing the hard mask and removing the sacrificial material layer in the first trench, the second trench and the third trench.

In yet another embodiment, a semiconductor device includes a dielectric layer disposed over a substrate and a high-k (HK) dielectric layer disposed over the dielectric layer. The HK dielectric layer defines a first trench and a second trench and a third trench in the first dielectric layer. The second trench is positioned between the first trench and the third trench. The first trench and the second trench have a first width and the third trench has a second width that is greater than the first width. The device also includes a sidewall-metal (SWM) layer disposed along a lower portion of sidewalls of the first trench and along a lower portion of sidewalls of the second trench and along sidewalls of the third trench. SWM layer along the lower portion of sidewalls of the first trench has that same height as it is disposed along the lower portion of sidewalls of the second trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first trench, a second trench, and a third trench extending through a dielectric layer over a substrate, wherein the first trench and the second trench have a first width, and further wherein the third trench has a second width that is greater than the first width;
    forming a material layer in the first trench, the second trench, and the third trench;
    forming a sacrificial layer over the material layer, wherein the sacrificial layer fills the first trench and the second trench while partially filling the third trench, wherein a height of the sacrificial layer in the first trench, a height of the sacrificial layer in the second trench, and a height of the sacrificial layer in the third trench are substantially the same;
    forming a patterning layer over the sacrificial layer in the third trench, wherein the patterning layer fills a remaining portion of the third trench;
    recessing the sacrificial layer in the first trench and the second trench, wherein a height of sacrificial layer remaining in the first trench is substantially the same as a height of sacrificial layer remaining in the second trench;
    recessing the material layer in the first trench and in the second trench, wherein a height of the material layer remaining in the first trench is substantially the same as a height of the material layer remaining in the second trench; and
    completely removing the patterning layer, the sacrificial layer remaining in the first trench and the second trench, and the sacrificial layer in the third trench.

2. The method of claim 1, wherein forming the sacrificial layer includes forming a dielectric layer.

3. The method of claim 2, wherein the dielectric layer includes silicon nitride.

4. The method of claim 1, wherein forming the first trench, the second trench, and the third trench includes removing a first dummy gate, a second dummy gate, and a third dummy gate, respectively.

5. The method of claim 4, further comprising forming a high-k dielectric layer in the first trench, the second trench, and the third trench before forming the material layer.

6. The method of claim 1, wherein the material layer is a work-function layer, the method further comprising forming a metal gate over the work-function layer in the first trench, the second trench, and the third trench after completely removing the patterning layer, the sacrificial layer remaining in the first trench and the second trench, and the sacrificial layer in the third trench.

7. The method of claim 1, wherein recessing the sacrificial layer in the first trench and the second trench includes selectively etching the sacrificial layer without substantial etching of the material layer.

8. The method of claim 1, wherein recessing the material layer in the first trench and the second trench includes selectively etching the material layer without substantial etching of the sacrificial layer.

9. The method of claim 1, wherein removing the remaining sacrificial layer in the first trench and the second trench includes selectively etching the sacrificial layer without substantial etching of the material layer.

10. The method of claim 1, wherein forming the sacrificial layer includes performing an atomic layer deposition (ALD).

11. A method comprising:
    removing a first dummy gate, a second dummy gate, and a third dummy gate to form a first trench, a second trench, and a third trench over a substrate, wherein the second trench is positioned between the first trench and the third trench, the first trench and the second trench have a first width, and the third trench has a second width that is different than the first width;
    forming a high-k dielectric layer and a work function layer in the first trench, the second trench, and the third trench, wherein the work function layer is disposed on the high-k dielectric layer;
    forming a sacrificial layer on the work function layer, such that the sacrificial layer fills the first trench and the second trench while partially filling the third trench, wherein a height of the sacrificial layer in the first trench and the second trench is substantially the same as a height of the sacrificial layer in the third trench;
    forming a patterned hard mask layer that exposes the sacrificial layer in the first trench and the second trench, wherein the patterned hard mask layer is disposed on the sacrificial layer in the third trench and fills a remaining portion of the third trench;
    recessing the sacrificial layer in the first trench and the second trench while the patterned hard mask layer covers the sacrificial layer in the third trench;
    recessing the work function layer in the first trench and the second trench while the patterned hard mask layer covers the sacrificial layer in the third trench, wherein a height of the recessed work function layer along sidewalls of the first trench is substantially the same as a height of the recessed work function layer along sidewalls of the second trench;
    selectively removing the patterned hard mask layer from the third trench;
    selectively removing the sacrificial layer from the first trench, the second trench, and the third trench; and
    forming a metal gate over the work function layer in the first trench, the second trench, and the third trench.

12. The method of claim 11, wherein recessing the sacrificial layer in the first trench and the second trench includes selectively etching the sacrificial layer relative to the work function layer.

13. The method of claim 11, wherein recessing the work function layer in the first trench and in the second trench includes selectively etching the work function layer relative to the sacrificial layer.

14. The method of claim 11, wherein removing the sacrificial layer in the first trench, the second trench, and the third trench includes selectively etching the sacrificial layer relative to the work function layer.

15. The method of claim 11, wherein forming the sacrificial layer includes performing an atomic layer deposition (ALD) to form a dielectric layer.

16. The method of claim 11, wherein a height of the work function layer along sidewalls of the third trench is greater than the height of the recessed work function layer along sidewalls of the first trench and the height of the recessed work function layer along sidewalls of the second trench.

17. The method of claim 11, wherein a thickness of the sacrificial layer above the first trench, the second trench, and the third trench is substantially the same.

18. A method comprising:
    forming a first trench in a first region and a second trench in a second region over a substrate, wherein the first trench has a first width and the second trench has a second width that is greater than the first width;
    depositing a first material layer and a second material layer in the first trench and the second trench, wherein the second material layer is deposited over the first material layer;
    depositing a dielectric layer over the second material layer, wherein the dielectric layer fills the first trench while partially filling the second trench, and further wherein a height of the dielectric layer in the first trench is substantially the same as a height of the dielectric layer in the second trench;
    forming a patterned resist layer over the dielectric layer in the second region, such that the patterned resist layer covers the second region and does not cover the first region, wherein the patterned resist layer fills a remaining portion of the second trench;
    etching back the dielectric layer in the first trench, such that a height of the dielectric layer remaining in the first trench is less than a height of the dielectric layer in the second trench;
    etching back the second material layer in the first trench, such that a height of the second material layer remaining in the first trench is less than a height of the second material layer in the second trench; and
    removing the patterned resist layer and the dielectric layer.

19. The method of claim 18, wherein forming the dielectric layer includes performing an atomic layer deposition (ALD) process to form a silicon nitride layer.

20. The method of claim 18, wherein the first material layer is a high-k dielectric layer and the second material layer is a work function metal layer, the method further comprising forming a metal layer over the second material layer in the first trench and the second trench after removing the patterned resist layer and the dielectric layer.

* * * * *